United States Patent [19]
Jaffe et al.

[11] 4,065,715
[45] Dec. 27, 1977

[54] PULSE DURATION MODULATED SIGNAL TRANSDUCER

[75] Inventors: James M. Jaffe, Los Altos, Calif.; John W. Hile, Birmingham, Mich.

[73] Assignee: General Motors Corporation, Detroit, Mich.

[21] Appl. No.: 702,110

[22] Filed: July 2, 1976

Related U.S. Application Data

[63] Continuation-in-part of Ser. No. 642,057, Dec. 18, 1975, abandoned, which is a continuation-in-part of Ser. No. 535,175, Dec. 23, 1974, abandoned.

[51] Int. Cl.² .............................................. G01R 27/26
[52] U.S. Cl. ......................... 324/60 CD; 307/235 T; 307/242; 307/265; 328/147; 328/148; 328/185; 332/9 R
[58] Field of Search ................. 332/9 R, 9 T; 328/58, 328/185, 147, 148, 135; 307/235 C, 235 B, 235 T, 242, 265, 246, 247 R; 324/60 CD, 60 C

[56] References Cited
U.S. PATENT DOCUMENTS

| | | | |
|---|---|---|---|
| 3,484,624 | 12/1969 | Rasiel et al. | 307/265 |
| 3,513,400 | 5/1970 | Russell | 332/9 T X |
| 3,638,183 | 1/1972 | Wessenberg | 307/235 C X |
| 3,965,388 | 6/1976 | Brisk | 307/235 T X |

*Primary Examiner*—Stanley T. Krawczewicz
*Attorney, Agent, or Firm*—Howard N. Conkey

[57] ABSTRACT

A transducer for producing a pulse duration modulated signal in accord with the value of a parameter. A reference capacitor-resistance circuit is provided having a predetermined rate of capacitor discharge and a second capacitor-resistance circuit is provided having a capacitor and a resistor, one of which is varied in accordance with the parameter to define a rate of capacitor discharge determined by the parameter. Each of the capacitors is periodically charged in unison to a predetermined voltage. Respective level detectors monitor the capacitor voltage charges and generate respective digital signals when the voltage charge monitored is greater than a predetermined reference below which each capacitor discharges during the time interval between charges. A logic circuit monitors the digital signals and produces a series of pulses having durations determined by the value of the parameter.

7 Claims, 3 Drawing Figures

PULSE DURATION MODULATED SIGNAL TRANSDUCER

This is a continuation-in-part of application Ser. No. 642,057, now abandoned, filed Dec. 18, 1975, which is a continuation-in-part of application Ser. No. 535,175, filed Dec. 23, 1974, now abandoned.

This invention relates to a transducer effective to produce a pulse duration modulated signal in accord with the value of a parameter. The invention has particular utility in providing an output representative of various parameters such as force, temperature, liquid level, and position. For example, the present invention may be used in conjunction with a capacitance probe immersed in a vehicle fuel tank to monitor the liquid level, wherein the capacitance of the probe is a function of the degree of submersion of the probe in the liquid or may be used as a vehicle throttle position indicator wherein a variable air tuning capacitor is mounted on the throttle shaft with its capacitance being varied as a function of throttle shaft rotation.

Many transducers are known which are effective to produce an output signal which is an indication of the value of a monitored parameter. Generally, these transducers provide an analogue signal output representing the magnitude of the monitored parameter. While these systems are effective for providing many indicating and control functions, this type of output is subject to interference from electrical noise and is not in a form readily usable in some systems such as microprocessor systems employed for control and diagnosis which require signals in digital form. The use of a microprocessor, such as on automobiles, requires input digital data derived from a large variety of sensors deployed about the automobile. For example, these sensors must detect fluid levels, positions or displacements, pressures, temperatures, and other variables and transmit this data to the centrally located microprocessor. It is the general object of this invention to provide a transducer circuit capable of being used in a multiplicity of sensing applications.

It is another object of this invention to provide an improved transducer effective to produce a digital output representative of the value of a monitored parameter.

It is another object of this invention to provide a transducer effective to produce a pulse duration modulated signal in accord with the value of a monitored parameter.

It is another object of this invention to provide an electronic circuit that interfaces with a wide variety of sensing elements which achieves the requirements of low cost, ruggedness, reliability, and accuracy.

It is another object of this invention to provide a transducer effective to produce a pulse duration modulated signal in accord with the value of a parameter as represented by varying reactance or resistance.

These and other objects of this invention are accomplished by means of a transducer including a reference reactance-resistance circuit defining a predetermined time constant and a second reactance-resistance circuit wherein one of the reactance element or resistance element is varied in accordance with a monitored parameter to define a time constant which is determined by the monitored parameter. Each of these reactance elements is periodically set to a predetermined voltage which varies thereafter, as the element charge varies, at a rate determined by the values of reactance and resistance. Respective level detectors monitor the reactor voltage and generate respective digital signals when the voltage monitored differs in a predetermined sense from a reference voltage through which the reactance voltage varies. A logic circuit monitors the digital signals and produces a series of pulses having durations determined by the value of the parameter.

The invention may be best understood by reference to the following description of the preferred embodiment and the drawings in which.

Figure 1:
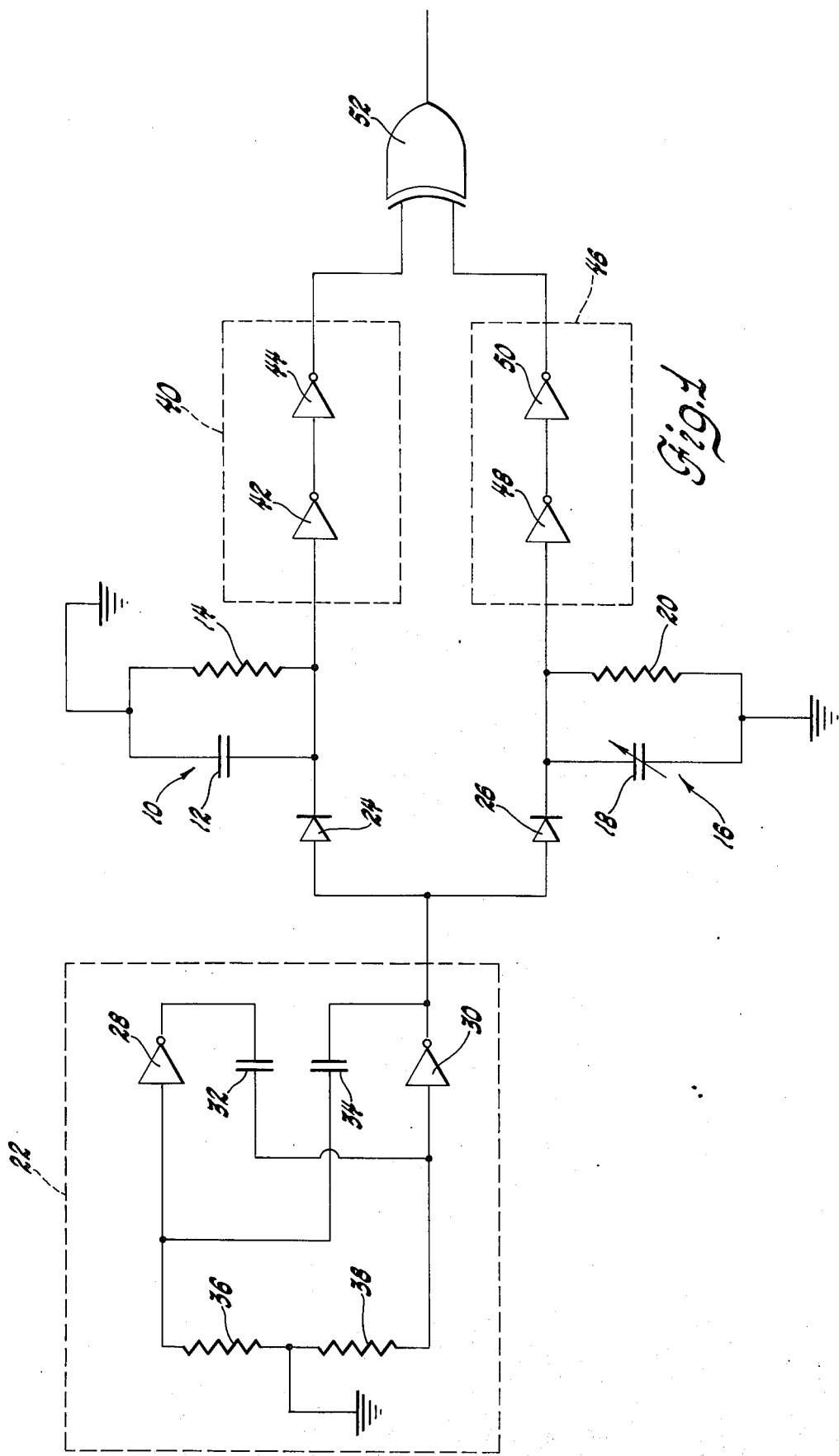
FIG. 1 is a schematic diagram of the transducer of this invention for providing a pulse duration modulated signal representing the value of a monitored parameter.

Referring to FIG. 1, there is illustrated a circuit for providing a pulse duration modulated digital signal comprised of a series of pulses each having a duration representing the value of a monitored parameter. The parameter monitored may be temperature, position, force, pressure, fluid level or any other parameter and which is monitored by a sensor whose output is either a variable reactance or resistance representative of the value of the parameter being measured.

For purposes of illustrating the invention, the preferred embodiment will be described with respect to the monitoring of the throttle angle of an automobile carburetor by a variable capacitance sensor controlled by the throttle shaft. The sensor output is a capacitance representing throttle angle.

A reference capacitor-resistance circuit 10 is comprised of a capacitor 12 parallel coupled with a resistor 14. One side of the parallel combination is coupled to a ground reference. The capacitor-resistance circuit 10 has a predetermined rate of capacitor discharge determined by the capacitance of the capacitor 12 and the resistance of the resistor 14.

A second capacitor-resistance 16 is comprised of a parallel coupled capacitor 18 and resistor 20. One side of the parallel combination is coupled to ground reference. The capacitor 18 is illustrated as a variable capacitor representing the variable capacitance of a throttle angle sensor with the capacitance being measure of the carburetor throttle angle. The resistor 20 has a resistance equal to the resistance of the resistor 14 in the reference capacitor-resistance circuit 10. The capacitance of the capacitor 18 varies in accordance with the carburetor throttle angle to define a rate of capacitor discharge determined by the throttle angle.

While the capacitor 18 is illustrated as varying in response to a monitored parameter to define a rate of capacitor discharge of the capacitor-resistance circuit 16 determined by the parameter, the capacitor 18 may be made constant and the resistor 20 made variable in response to a monitored parameter to define a rate of capacitor discharge of the capacitor-resistance circuit 16 determined by the parameter.

A pulse generator 22 supplies a periodic voltage pulse signal having voltage pulses of predetermined duration and spacing. These pulses are applied across each of the capacitor-resistance circuits 10 and 16 through respective diodes 24 and 26 to charge the capacitors 12 and 18. The output impedance of the pulse generator 22 is made low relative to the parallel combination of the resistors 14 and 20 so that the capacitor 12 and the capacitor 18 of the throttle angle sensor are quickly charged to the level of the output voltage from the pulse generator 22. Upon termination of the pulse output of the pulse generator 22, the diodes 24 and 26 present a very high impedance from the capacitor-resistance circuits 10 and 16 to the output of the pulse generator 22 to prevent the discharge of the capacitor 12 and the capacitor 18 of the throttle angle transducer into the output of the pulse generator 22 and thereby minimize the effect of the pulse generator 22 on the rate of capacitor discharge of each of the capacitor-resistance circuits 10 and 16.

The pulse generator 22 includes an inverter 28 and an inverter 30 each having its output coupled to the input of the other through respective capacitors 32 and 34. A pair of resistors 36 and 38 having their junction grounded are coupled between the inputs of the inverters 28 and 30. The output of the pulse generator 22 is provided at the output of the inverter 30 which is coupled to the anodes of the diodes 24 and 26.

The pulse generator 22, as illustrated, is a repetitive pulse generator with each voltage pulse having a duration determined by the capacitance of the capacitor 34 and the resistance of the resistor 36 with the spacing between the pulses being determined by the value of the capacitor 32 and the resistance of the resistor 38. As previously indicated, pulse generator 22 has an output impedance much smaller than the parallel combination of the resistors 14 and 20 so as to charge the capacitor 12 and the capacitor 18 quickly. Further, the circuit element values are chosen such that each charge pulse output of the pulse generator 22 has a duration sufficient to charge the capacitors 12 and 18 to the level of the voltage pulse output of the pulse generator 22.

The voltage charge across the capacitor 12 is coupled to the input of a threshold detector 40 comprised of series coupled inverters 42 and 44. The threshold level of the threshold detector 40 is determined by the switching level of the inverter 42 which generates a digital logic 0 at its output when the magnitude of the voltage at its input exceeds its switching level and generates a digital logic 1 when the voltage at its input is below its switching level. The inverter 44 functions to invert the output of the inverter 42 such that the output of the threshold detector 40 is a digital logic 1 when the voltage across the capacitor 12 is above the switching level of the inverter 42 and is a digital logic 0 when the voltage across the capacitor 12 is below the switching level of the inverter 42. The inverter 42 is selected so that its switching level is a predetermined level below the voltage level to which the capacitors 12 and 18 are charged by the pulse generator 22 and below which each of the capacitors 12 and 18 discharge during the time interval between voltage pulses from the pulse generator 22.

The voltage across the sensing capacitor 18 monitoring the throttle angle position is coupled to the input of a threshold detector 46 identical to the threshold detector 40. The threshold detector 46 is comprised of series coupled inverters 48 and 50. When the voltage charge across the capacitor 18 exceeds the switching level of the inverter 48, the output of the threshold detector 46 is a digital logic 1 and when the voltage charge is below the switching level of the inverter 48 the output of the threshold detector 46 is a digital logic 0.

The inverters 42 and 48 are selected such that they have a very high input impedance relative to the resistance of the resistors 14 and 20 and a very low input capacitance so as to minimize the effect of the threshold detectors 40 and 46 on the rate of capacitor discharge of the capacitor-resistance circuits 10 and 16.

The outputs of the threshold detectors 40 and 46 are coupled to respective inputs of an EXCLUSIVE OR logic gate 52. The EXCLUSIVE OR gate 52 functions to generate a digital logic 1 when either one or the other but not both of the inputs thereof is at a digital logic 1.

The threshold level or switching level of the threshold circuit 40 and 46, the values of the circuit elements in the capacitor-resistance circuits 10 and 16 and in the pulse generator 22 are such that each voltage pulse output of the pulse generator 22 has a duration sufficient to charge the capacitor 12 and the capacitor 18 to a level above the threshold level of the threshold detectors 40 and 46 and are such that the time interval between the pulses from the pulse generator 22 are sufficient for the capacitor 12 and the capacitor 18 to discharge through the respective resistors 14 and 20 to a level below the threshold or switching level of the threshold detectors 40 and 46.

Figure 2:
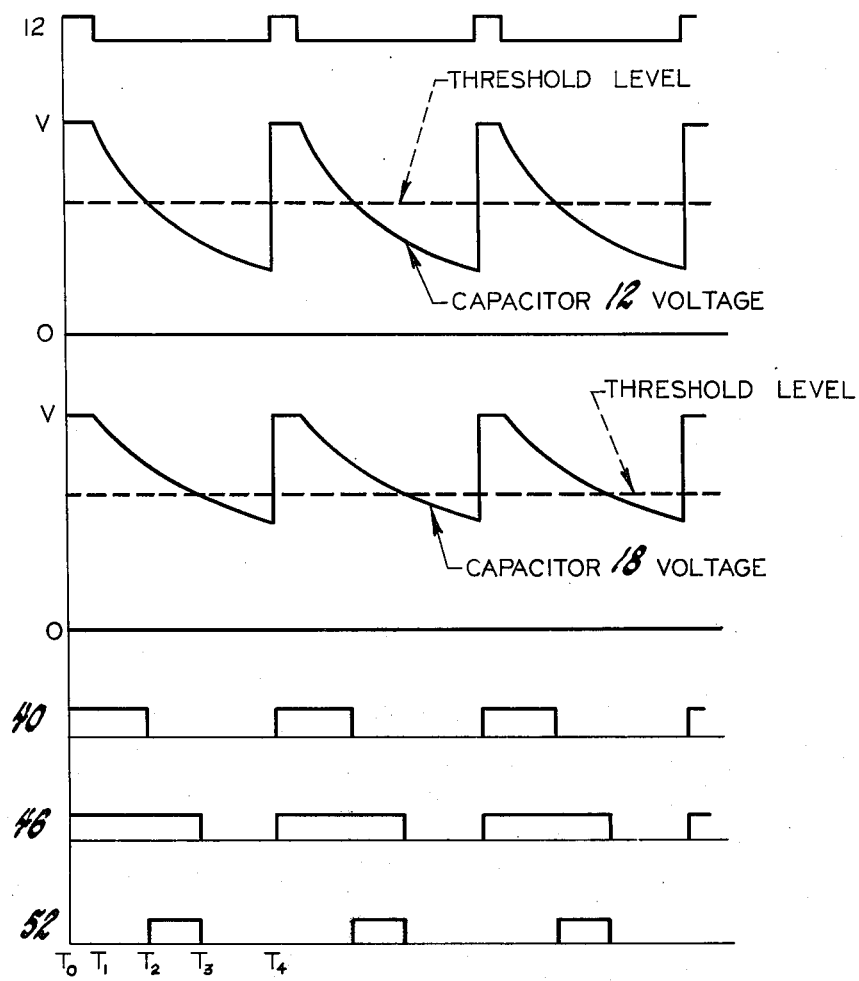
FIG. 2 is a timing and voltage diagram for the transducer of FIG. 1.

Referring to FIGS. 1 and 2, the circuit of FIG. 1 operates as follows: at time $T_0$, the pulse generator 22 generates a voltage pulse which is coupled across the capacitors 12 and 18 through the respective diodes 24 and 26. The capacitors 12 and 18 are quickly charged to a voltage level V above the threshold level of the threshold detectors 40 and 46. The outputs of the threshold detectors 40 and 46, therefore, shift to a digital logic 1 resulting in a digital logic 0 at the output of the EXCLUSIVE OR gate 52.

At time $T_1$, the voltage pulse at the output of the pulse generator 22 shifts to ground potential and the capacitors 12 and 18 begin to discharge through their respective resistors 14 and 20. The rate of discharge of the capacitor 12 is determined by the capacitance of the capacitor 12 and the resistance of the resistor 14 and the rate of discharge of the capacitor 18 is determined by the resistance of the resistor 20 and the capacitance of the capacitor 18 which is determined by the throttle angle of the vehicle.

The rate of discharge of the capacitor 18 in the specific example of FIG. 2 is determined by a particular throttle angle which is such that the voltage charge across the capacitor 18 decreases to the threshold level of the threshold detector 46 at time $T_2$. At this time, the output of the threshold detector 46 shifts from a digital logic 1 to a digital logic 0. As the output of the threshold detector 40 at time $T_2$ remains a digital logic 1, the output of the EXCLUSIVE OR gate 52 shifts to a digital logic 1. The rate of discharge of the capacitor 12 is such that at time $T_3$, the voltage charge thereacross decreases to the threshold or switching level of the threshold detector 40 and the output of the threshold detector 40 shifts to a digital logic 0. At this time, each input to the EXCLUSIVE OR gate 52 is a digital logic 0 and the output thereof shifts to a digital logic 0. The cycle is then repeated beginning at time $T_4$ wherein the next voltage pulse from the pulse generator 22 charges the capacitors 12 and 18 to the voltage level V.

Since the capacitance of the capacitor 18 varies in accordance with the throttle angle, the rate of discharge of the capacitor 18 also varies in accordance with throttle angle so that the time required for the capacitor 18 to discharge to below the threshold level of the threshold detector 46 varies in accordance with the throttle angle. Consequently, the time duration between the time that the capacitor 18 discharges to the threshold level and the time that the capacitor 12 discharges to the threshold level varies as a function of the capacitance of the capacitor 18 and consequently the throttle angle. As the output of the EXCLUSIVE OR gate 52 represents this time duration, the time duration of the pulse output thereof is determined by the throttle angle. The resulting waveform output of the EXCLUSIVE OR gate 52 is a series of pulses having durations representing throttle angle. For example, if the capacitance of the capacitor 12 is equal to the capacitance of the throttle angle transducer at zero throttle angle, and capacitors 12 and 18 discharge in identical manner when the throttle angle is zero and the threshold detectors 40 and 46 shift simultaneously. Consequently, the output of the EXCLUSIVE OR gate 52 remains a constant digital logic 0 representing zero throttle angle. At progressively increasing throttle angles, the value of the capacitance of the capacitor 18 varies so that its rate of discharge varies from the rate of discharge of the capacitor 12 resulting in a digital logic 1 pulse at the output of the EXCLUSIVE OR gate 52 having a duration representing the difference in the capacitance between the capacitor 12 and the capacitor 18 and consequently the carburetor throttle angle.

Figure 3:
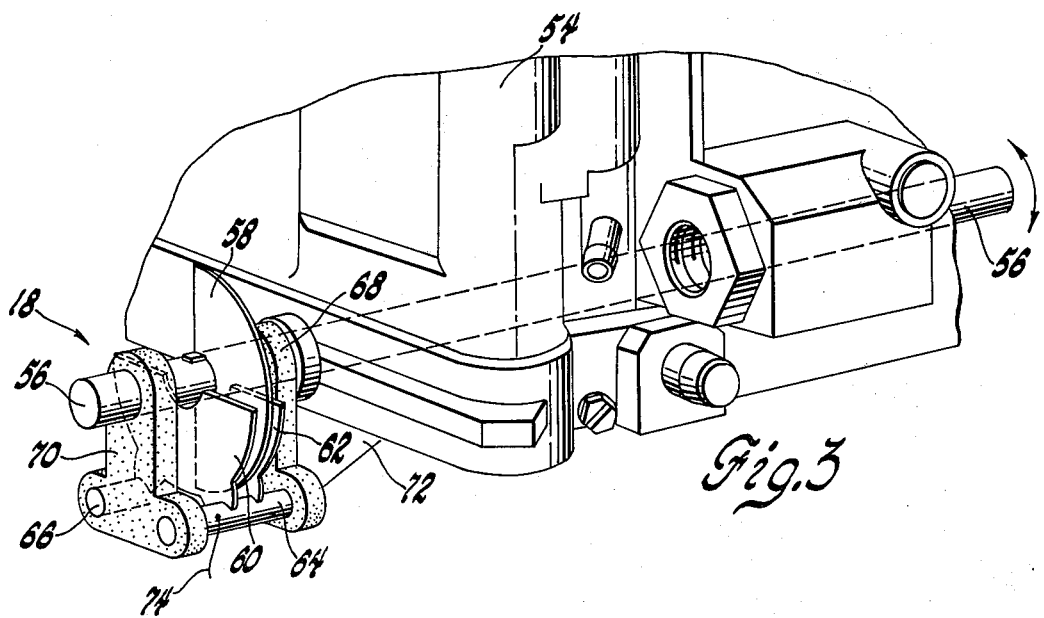
FIG. 3 is an example of a sensor for use with the transducer of FIG. 1 for monitoring the position of the throttle angle of an automotive vehicle.

Referring to FIG. 3, there is illustrated an example of one form of the variable capacitor 18 for providing a capacitance varying in accordance with the carburetor throttle angle. A portion of an automobile carburetor 54 is illustrated having a throttle shaft 56 extending therethrough which is rotated by the automobile operator through conventional throttle linkages to control the throttle. The variable capacitor 18 is mounted on the carburetor and includes a movable conducting plate 58 mounted on and rotated by the throttle shaft 56 between a pair of parallel stationary conducting plates 60 and 62. The stationary plates 60 and 62 are mounted in parallel relationship on a pair of conducting members 64 and 66 carried by a pair of nonconducting upright members 68 and 70 through which the throttle shaft 56 protrudes. The plates 60, 62, and members 64, 66, 68 and 70 are held against rotation by a bracket 72 securing the assembly to the carburetor 54. The plate 58 is electrically grounded by nature of its connection to the throttle shaft 56 and the plates 60 and 62 are electrically coupled by nature of their common connection to the members 64 and 66. The variable capacitor 18 illustrated in a conventional variable air tuning capacitor whereby the area between the plate 58 and the plates 60 and 62 is varied by rotation of the throttle shaft to vary the capacitance between the plate 58 and the plates 60 and 62 in accordance with throttle angle. The capacitance is obtained between ground and a conductor 74.

The embodiment described relates to the measurement of a parameter by a specific capacitance sensor. The variable capacitor 18 could take other forms such as a variable capacitance probe for measuring vehicle fuel level. In this application, the capacitance probe could take the form of two parallel plates immersed in the fuel whose level is to be indicated. The capacitance of the probe is then a function of the degree to which the probe is submerged in the fuel. The capacitor 12 could then take the form of a capacitor completely immersed in the fuel and which has a capacitance equal to the capacitance of the variable capacitor 18 when the vehicle fuel tank is empty. In this manner the reference capacitor 12 provides compensation for variances in the dielectric constant of the fuel used.

The circuit of FIG. 1 was constructed and used in conjunction with the variable capacitor of FIG. 3 to provide an indication of throttle angle. The circuit was constructed of CMOS logic having a typical input impedance of approximately $10^{12}$ ohms, an input capacitance of 5.5 pfd and an output impedance of approximately 600 ohms. The resistors 14 and 20 each had a resistance of 100K ohms, the reference capacitor 12 had a capacitance of 5.4 pfd and the throttle angle capacitor 18 had a capacitance varying from 5.4 pfd at 0% throttle to 19.8 pfd at 100% throttle. The oscillator 22 was operated at a frequency of 100 KHz with an on time of $1 \times 10^{-6}$ seconds.

The circuit of FIG. 1 was also constructed and used with a capacitor which was variable in response to fuel level. In this application the following values were used: resistors 14 and 20 — 27K ohms; capacitor 12 — 150 pfd; capacitor 18 — 150 pfd (fuel tank empty) to 300 pfd (fuel tank full); and oscillator 22 —1.2 KHz with 0.2 $\times 10^{-3}$ second on time.

Although the preferred embodiment was described using a capacitance sensor providing a capacitance varying in accord with the value of a parameter, the circuit may also be used with a variable resistance sensor whose resistance represents the value of a monitored parameter. When the system is used with a variable resistance sensor, the capacitance 18 is made constant and the resistor 20 comprises the variable resistor sensor whose resistance is variable as a function of the monitored parameter. For example, the resistor 20 could take the form of a temperature responsive device such as a thermistor whose resistance varies as a function of temperature to vary the discharge rate of the capacitor 18 to thereby provide at the output of the EXCLUSIVE OR gate 52 a pulse duration modulated signal the duration of which is determined by the value of the resistance 20 and, therefore, the temperature represented thereby.

The invention further contemplates a circuit in which the capacitors are fully discharged in each cycle and then charged by a pulse generator through a respective resistor with the time rate of charge being determined by the resistors and capacitors. The level detectors 40 and 46 would then be selected to provide an output while the voltage charge is below a set threshold.

The foregoing circuits are described with the reactance-resistance circuits each including a capacitor. As would be apparent to one skilled in the art, the reactor elements could each take the form of an inductor (one variable in response to a condition) which, in conjunction with the associated resistor, defines a time constant. For example, the resistor and inductor in each of the reference and variable circuits may be series coupled. Each inductor may then be repeatedly set to a zero charge condition, i.e., zero current, and thereafter charged by applying a voltage pulse across the series resistor and inductor. Application of the voltage pulse across the resistor and inductor sets an initial voltage across the inductor which descreases exponentially as the current through the inductor increases exponentially during charging thereof.

This voltage is represented by the equation $-(E_p - RI_o) \epsilon^{-Rt/L}$ where $E_p$ is the magnitude of the voltage pulse, $R$ is the resistance of the resistor series coupled with the inductor, $L$ is the inductance of the inductor and $I_o$ is the current through the series circuit at time $t_o$. $I_o$ in this example is assumed to be zero. The voltage across the inductors may be monitored by the level detectors 40 and 46 to provide a pulse duration modulated signal at the output of the EXCLUSIVE OR gate 52 representing the condition.

Whether the reactance element or the resistor is variable in accordance with a parameter, the three nonvarying elements are effective to provide compensation for temperature, dielectric constants or any other external factor which may adversely influence the input variable to thereby provide maximum transducer accuracy.

The output of the EXCLUSIVE OR gate 52 is a digital signal from which a digital readout of the parameter being monitored may be readily obtained. For example, the output of the EXCLUSIVE OR gate 52 can be used to enable a gate to pass high frequency clock pulses to a counter with a number of pulses counted during the time period of one of the pulse outputs of the EXCLUSIVE OR gate 52 representing the magnitude of the monitored parameter. The output of the counter could then be used to drive a digital display to provide an indication of the monitored parameter or could otherwise be used in an automobile microprocessor for controlling vehicle operation.

In view of the fact that the output of the EXCLUSIVE OR gate 52 represents the absolute magnitude of the difference between the time rate of discharge (or charge) of the reactance-resistance circuits, the time rate of discharge (or charge) of the reference-reactance-resistance circuit 10 should not be within the range rates of the variable reactance-resistance circuit for all anticipated values of the monitored parameter to avoid any possible ambiguity. Therefore, selection of the discharge (or charge) rate of the reference reactance-resistance circuit so as to be equal to or less than the lowest rate of discharge (or charge) of the variable reactance-resistance network or equal to or greater than the highest rate of discharge (or charge) of the variable reactance-resistance network prevents such ambiguities from arising. For example, assuming a capacitance transducer monitoring a parameter is employed as illustrated in FIG. 1, the capacitance of the capacitor 12 should not be within the range capacitance of the capacitor 18 for all anticipated values of the monitored parameter so as to avoid an ambiguous indication of the parameter. The capacitance of the capacitor 12 should be equal to or less than the lower limit of capacitance of the capacitor 18 or equal to or greater than the upper limit of capacitance of the capacitor 18. Further, by making the capacitance of the reference capacitor 12 equal to either the upper or lower limit of the capacitance of the capacitor 18 as determined by the upper or lower limits of the parameter being monitored, a zero level for a measuring circuit can be established.

The detailed description of the invention for the purpose of explaining the principles thereof is not to be considered as limiting or restricting the invention, since many modifications may be made by the exercise of skill in the art without departing from the scope of the invention.

What is claimed is:

1. A transducer effective to produce a pulse duration modulated signal in accord with the value of the parameter, comprising in combination:

a reference capacitor-resistance circuit having a first capacitor and a first resistance defining a predetermined rate of capacitor discharge;

a second capacitor-resistance circuit having a second capacitor and a second resistance, at least one of which varies in accordance with the parameter to define a rate of capacitor discharge determined by the parameter;

means effective to produce a periodic pulse signal having pulses of predetermined duration and spacing;

means responsive to said pulse signal effective to charge said first and second capacitors in unison during the time of duration of each pulse signal to a predetermined voltage value;

means responsive to the voltage across the first capacitor effective to produce a first digital signal when such voltage exceeds a predetermined reference value less than the predetermined voltage value and below which the first capacitor discharges during the time interval between successive pulse signals;

means responsive to the voltage across the second capacitor effective to produce a second digital signal when such voltage exceeds the predetermined reference value below which the second capacitor discharges during the time interval between successive pulse signals; and a logic circuit responsive to the first and second digital signals effective to generate a series of pulses commencing after the termination of the shortest one of the first or second digital signals and having durations determined by the value of said parameter.

2. A transducer effective to produce a pulse duration modulated signal in accord with the value of a parameter, comprising in combination:

a reference capacitor-resistance circuit having a first capacitor and a first resistance defining a predetermined rate of capacitor discharge;

a second capacitor-resistance circuit having a second capacitor and a second resistance, at least one of which varies in accordance with the parameter to define a rate of capacitor discharge determined by the parameter, the first and second capacitors and the first and second resistors having respective capacitance and resistance values so that the rate of capacitor discharge of the second capacitor-resistance circuit is equal to or differs from the predetermined rate of capacitor discharge in a predetermined sense for all values of the second capacitor or second resistor that is varied in accordance with the parameter;

means effective to produce a periodic pulse signal having pulses of predetermined duration and spacing;

means responsive to said pulse signal effective to charge said first and second capacitors in unison during the time of each pulse signal to a predetermined voltage value;

means responsive to the voltage across the first capacitor effective to produce a first digital signal when such voltage exceeds a predetermined reference value less than the predetermined voltage value and below which the first capacitor discharges during the time interval between successive pulse signals;

means responsive to the voltage across the second capacitor effective to produce a second digital signal when such voltage exceeds the predetermined reference value below which the second capacitor discharges during the time interval between successive pulse signals; and a logic circuit responsive to the first and second digital signals effective to generate an output digital pulse when one and not both of the first and second digital signals is being generated to thereby supply a series of output digital pulses having durations determined by the value of said parameter.

3. A transducer effective to produce a pulse duration modulated signal in accord with the value of a parameter, comprising in combination:
   a reference capacitor-resistor circuit comprised of a first capacitor and a first resistor coupled in parallel, the first capacitor and the first resistor defining a reference rate of capacitor discharge;
   a second capacitor-resistor circuit comprised of a second capacitor and a second resistor coupled in parallel, one of the second capacitor or second resistor being varied in accordance with the parameter to define a rate of capacitor discharge determined by the parameter, the first and second capacitors and the first and second resistors having respective capacitance and resistance values so that the rate of capacitor discharge of the second capacitor-resistance circuit is equal to or differs from the predetermined rate of capacitor discharge in a predetermined sense for all values of the second capacitor or second resistor that is varied in accordance with the parameter;
   means effective to produce a periodic pulse signal having pulses of predetermined duration and spacing;
   means responsive to said pulse signal effective to charge said first and second capacitors in unison during the time of each pulse signal to predetermined voltage value, the first and second capacitors discharging through the first and second resistors, respectively, during the time interval between successive pulse signals to respective values below a predetermined threshold level;
   a first threshold detector responsive to the voltage across the first capacitor effective to produce a first digital signal when such voltage exceeds the predetermined threshold level;
   a second threshold detector responsive to the voltage across the second capacitor effective to produce a second digital signal when such voltage exceeds the predetermined threshold level; and
   a logic circuit responsive to the first and second digital signals effective to generate a series of pulses commencing after the termination of the shortest one of the first or second digital signals and having durations determined by the value of said parameter.

4. A transducer effective to produce a pulse duration modulated signal in accord with the value of a parameter, comprising in combination:
   a reference capacitor having a predetermined capacitance;
   a variable capacitor having a capacitance varying in accordance with the parameter, the capacitance of the variable capacitor being equal to or varying from the capacitance of the reference capacitor in a predetermined sense for all values of the parameter;
   means for repeatedly charging the variable and reference capacitors to a specified voltage level;
   first discharge means coupled across the reference capacitor for discharging said reference capacitor during the time interval between chargings thereof at a rate related to the capacitance thereof and to a voltage below a threshold voltage;
   second discharge means coupled across the variable capacitor for discharging said variable capacitor during the time interval between chargings thereof at a rate related to the capacitance thereof and to a voltage below the threshold voltage;
   a threshold detector coupled to the reference capacitor for generating a first digital signal when the voltage charge on the reference capacitor exceeds the threshold voltage;
   a second threshold detector coupled to the variable capacitor for generating a second digital signal when the voltage charge on the variable capacitor exceeds the threshold voltage; and
   a logic circuit responsive to the first and second digital signals effective to generate a series of pulses commencing after the termination of the shortest one of the first or second digital signals and having durations determined by the value of said parameter.

5. A transducer effective to produce a pulse duration modulated signal in accord with the value of a parameter, comprising in combination:
   a variable capacitor having a capacitance varying from a limit capacitance in accordance with the value of the parameter, the capacitance of the variable capacitor having a fixed polarity relative to the limit capacitance;
   a reference capacitor having a capacitance equal to the limit capacitance;
   a first resistor parallel coupled with the variable capacitor;
   a second resistor parallel coupled with the reference capacitor, the first and second resistors having equal resistance;
   means effective to produce a periodic pulse signal having pulses of predetermined duration and spacing;
   means responsive to said pulse signal effective to charge said first and second capacitors in unison during the time of each pulse signal to a predetermined voltage value, the variable and reference capacitors discharging through the first and second resistors respectively during the time interval between successive pulse signals to respective values below a predetermined threshold level;
   a first threshold detector coupled to the reference capacitor for generating a first digital signal when the voltage across the reference capacitor exceeds the threshold voltage;
   a second threshold detector coupled to the variable capacitor for generating a second digital signal when the voltage across the variable capacitor exceeds the threshold voltage; and
   an exclusive or logic gate coupled to the first and second threshold detectors for generating a digital output signal when one and not both of the first and second digital signals is generated, whereby the exclusive or logic gate provides a series of digital output pulses having durations determined by the value of said parameter.

6. A transducer effective to produce a pulse duration modulated signal in accord with the value of the parameter, comprising in combination:
   a reference circuit having a first reactor and a first resistor defining a predetermined time constant;
   a second circuit having a second reactor and a second resistor, at least one of which varies in accordance with the parameter to define a time constant determined by the parameter;

means effective to repeatedly set a predetermined voltage across said first and second reactors in unison, the voltage across the first and second reactors varying after each repeated setting at rates determined by the respective time constants of the reference and second circuits;

means responsive to the voltage across the first reactor effective to produce a first digital signal when said voltage attains a predetermined reference value;

means responsive to the voltage across the second reactor effective to produce a second digital signal when said voltage attains the predetermined reference value; and a logic circuit responsive to the first and second digital signals effective to generate a series of pulses, each pulse commencing upon the termination of the shortest one of the first or second digital signals and terminating upon the termination of the longest one of the first or second digital signals, each pulse having a duration determined by the value of said parameter.

7. A transducer effective to produce a pulse duration modulated signal in accord with the value of the parameter, comprising in combination:

a reference circuit having a first capacitor and a first resistor defining a predetermined rate of capacitor charge;

a second circuit having a second capacitor and a second resistor, at least one of which varies in accordance with the parameter to define a rate of capacitor charge determined by the parameter;

means effective to repeatedly set said first and second capacitors in unison to a predetermined voltage charge, the charge on the first capacitor varying after each repeated setting at the predetermined rate and the charge on the second capacitor varying after each repeated setting at the rate determined by the parameter;

means responsive to the voltage across the first capacitor effective to produce a first digital signal when such voltage attains a predetermined reference value different from the predetermined voltage charge, the voltage across the first capacitor attaining the predetermined reference value during each cycle;

means responsive to the voltage across the second capacitor effective to produce a second digital signal when such voltage attains the predetermined reference value, the voltage across the second capacitor attaining the predetermined reference value during each cycle; and a logic circuit responsive to the first and second digital signals effective to generate a series of pulses, each pulse commencing upon the termination of the shortest one of the first or second digital signals and terminating upon the termination of the longest one of the first or second digital signals each pulse having a duration determined by the value of said parameter.

* * * * *